(12) United States Patent
Hoshino

(10) Patent No.: US 12,009,375 B2
(45) Date of Patent: Jun. 11, 2024

(54) IMAGING DEVICE AND IMAGING ELEMENT

(71) Applicant: SONY SEMICONDUCTOR SOLUTIONS CORPORATION, Kanagawa (JP)

(72) Inventor: Kazuhiro Hoshino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 553 days.

(21) Appl. No.: 17/250,727

(22) PCT Filed: Jul. 10, 2019

(86) PCT No.: PCT/JP2019/027354
§ 371 (c)(1),
(2) Date: Feb. 24, 2021

(87) PCT Pub. No.: WO2020/049867
PCT Pub. Date: Mar. 12, 2020

(65) Prior Publication Data
US 2021/0399026 A1 Dec. 23, 2021

(30) Foreign Application Priority Data
Sep. 5, 2018 (JP) .................. 2018-166339

(51) Int. Cl.
H01L 27/146 (2006.01)
H04N 23/741 (2023.01)

(52) U.S. Cl.
CPC .... H01L 27/1461 (2013.01); H01L 27/14607 (2013.01); H01L 27/14621 (2013.01);
(Continued)

(58) Field of Classification Search
CPC ........... H01L 27/1461; H01L 27/14607; H01L 27/14621; H01L 27/14727; H04N 23/741
See application file for complete search history.

(56) References Cited

U.S. PATENT DOCUMENTS 8,729,474 B1 * 5/2014 Kurth ................ H01L 27/14607
250/338.4
10,784,304 B2 * 9/2020 Yamashita ............ H01L 27/146
(Continued)

FOREIGN PATENT DOCUMENTS

CN 104280803 A 1/2015
CN 108780803 A 11/2018
(Continued)

OTHER PUBLICATIONS

International Search Report and Written Opinion of PCT Application No. PCT/JP2019/027354, issued on Sep. 24, 2019, 09 pages of ISRWO.

Primary Examiner — Nathan W Ha
(74) Attorney, Agent, or Firm — CHIP LAW GROUP

(57) ABSTRACT

Provided is a device in which each pixel of an imaging element is divided into a plurality of pixel regions with different sensitivities of which central positions coincide with each other, and a high dynamic range image is generated on the basis of an output of each region. An imaging element is included on which imaging light is incident through a micro lens corresponding to each pixel. Each pixel of the imaging element includes a high-sensitive pixel region at a central portion of the pixel and a low-sensitive pixel region configured at an inner peripheral portion near sides of the pixel and surrounding the high-sensitive pixel region, and has a configuration in which central positions of the high-sensitive pixel region and the low-sensitive pixel region coincide with each other. Moreover, a medium-
(Continued)

sensitive pixel region may be included between the high-sensitive pixel region and the low-sensitive pixel region.

15 Claims, 13 Drawing Sheets

(52) U.S. Cl.
CPC .. *H01L 27/14627* (2013.01); *H01L 27/14645* (2013.01); *H04N 23/741* (2023.01)

(56) References Cited

U.S. PATENT DOCUMENTS

| | | | |
|---|---|---|---|
| 10,872,919 B2* | 12/2020 | Takizawa | H04N 25/585 |
| 10,998,357 B2* | 5/2021 | Kido | H01L 27/1461 |
| 2009/0101953 A1* | 4/2009 | Hayashi | H01L 27/14647 257/292 |
| 2009/0272880 A1* | 11/2009 | Stanton | H01L 27/14621 257/E31.127 |
| 2010/0060756 A1* | 3/2010 | Inuiya | H01L 27/14621 348/280 |
| 2010/0178018 A1* | 7/2010 | Augusto | H01L 27/14629 385/131 |
| 2011/0019041 A1* | 1/2011 | Ishiwata | H04N 25/77 257/E31.127 |
| 2013/0194482 A1* | 8/2013 | Nicol | G06F 30/00 348/340 |
| 2013/0215238 A1* | 8/2013 | Yamazaki | H04N 25/702 348/49 |
| 2013/0258259 A1* | 10/2013 | Nakai | H04N 25/60 359/891 |
| 2013/0293871 A1* | 11/2013 | Gruev | G01J 3/0224 356/73 |
| 2014/0091205 A1* | 4/2014 | Takamiya | H01L 27/14627 29/592.1 |
| 2014/0253767 A1* | 9/2014 | Kato | H04N 25/134 257/432 |
| 2014/0267848 A1* | 9/2014 | Wu | H04N 25/75 348/277 |
| 2015/0002707 A1 | 1/2015 | Wu | |
| 2015/0206921 A1* | 7/2015 | Imoto | H01L 27/14812 257/230 |
| 2015/0287766 A1* | 10/2015 | Kim | H01L 27/14641 257/40 |
| 2015/0319412 A1* | 11/2015 | Koshiba | H04N 25/134 348/246 |
| 2016/0268220 A1* | 9/2016 | Tsai | H01L 27/14627 |
| 2016/0293661 A1* | 10/2016 | Keefe | H01L 27/14683 |
| 2016/0293873 A1* | 10/2016 | Yamaguchi | H10K 30/10 |
| 2016/0315112 A1* | 10/2016 | Park | H01L 27/14623 |
| 2017/0221956 A1* | 8/2017 | Tsukimura | H01L 27/14634 |
| 2017/0317117 A1* | 11/2017 | Ukigaya | H01L 27/14645 |
| 2017/0323171 A1* | 11/2017 | Mehrl | H04N 5/33 |
| 2017/0339364 A1* | 11/2017 | Vaara | H01L 27/14609 |
| 2017/0373105 A1* | 12/2017 | Galor Gluskin | H04N 23/67 |
| 2018/0076243 A1* | 3/2018 | Tashiro | H01L 27/1461 |
| 2018/0118865 A1* | 5/2018 | Arayama | G03F 7/027 |
| 2018/0120485 A1* | 5/2018 | Oota | H01L 27/14 |
| 2018/0233521 A1* | 8/2018 | Na | G01S 7/4914 |
| 2018/0302597 A1* | 10/2018 | Honda | H01L 27/14627 |
| 2018/0359434 A1* | 12/2018 | Tanaka | H04N 23/54 |
| 2019/0006399 A1* | 1/2019 | Otake | H01L 27/14634 |
| 2019/0006401 A1* | 1/2019 | Kim | H04N 23/54 |
| 2019/0096933 A1* | 3/2019 | Kido | H01L 27/1463 |
| 2019/0348453 A1* | 11/2019 | Lee | H01L 27/14621 |
| 2020/0066768 A1* | 2/2020 | Cheng | H01L 27/1464 |
| 2020/0066771 A1* | 2/2020 | Köklü | H01L 27/1461 |
| 2020/0213538 A1* | 7/2020 | Sano | H01L 31/1075 |
| 2020/0227467 A1* | 7/2020 | Yokogawa | H01L 27/14603 |
| 2021/0134854 A1* | 5/2021 | Poikonen | H01L 27/14643 |
| 2021/0136309 A1* | 5/2021 | Koga | H04N 25/76 |
| 2021/0313358 A1* | 10/2021 | Lei | H01L 27/14643 |
| 2021/0366961 A1* | 11/2021 | Yanagita | H01L 27/14621 |

FOREIGN PATENT DOCUMENTS

| | | |
|---|---|---|
| EP | 2822036 A2 | 1/2015 |
| JP | 2004-079747 A | 3/2004 |
| JP | 2015-012619 A | 1/2015 |
| JP | 2015-153859 A | 8/2015 |
| JP | 2018-082002 A | 5/2018 |
| JP | 2019-91733 A | 6/2019 |
| KR | 10-2015-0003687 A | 1/2015 |
| TW | 201518830 A | 5/2015 |
| WO | 2017/169241 A1 | 10/2017 |
| WO | 2017/169754 A1 | 10/2017 |

* cited by examiner

FIG. 1A   PLAN VIEW (TOP VIEW)

FIG. 1B   CROSS-SECTIONAL VIEW (TOP VIEW)

FIG. 2A RGB ARRAY (BAYER ARRAY)

FIG. 2B RGBW ARRAY

FIG. 2C RGBIR ARRAY

FIG. 7

| PIXEL OUTPUT CONTROL UNIT SETTING | PIXEL VALUE LEVEL | | |
|---|---|---|---|
| | (L1) 0 TO HIGH-SENSITIVE PIXEL SATURATION LEVEL | (L2) HIGH-SENSITIVE PIXEL SATURATION LEVEL TO MEDIUM-SENSITIVE PIXEL SATURATION LEVEL | (L3) MEDIUM-SENSITIVE PIXEL SATURATION LEVEL TO LOW-SENSITIVE PIXEL SATURATION LEVEL |
| (1) OUTPUT GATE (Txh) FOR HIGH-SENSITIVE PIXEL | ON | OFF | OFF |
| (2) OUTPUT GATE (Txm) FOR MEDIUM-SENSITIVE PIXEL | ON | ON | OFF |
| (3) OUTPUT GATE (Txl) FOR LOW-SENSITIVE PIXEL | ON | ON | ON |

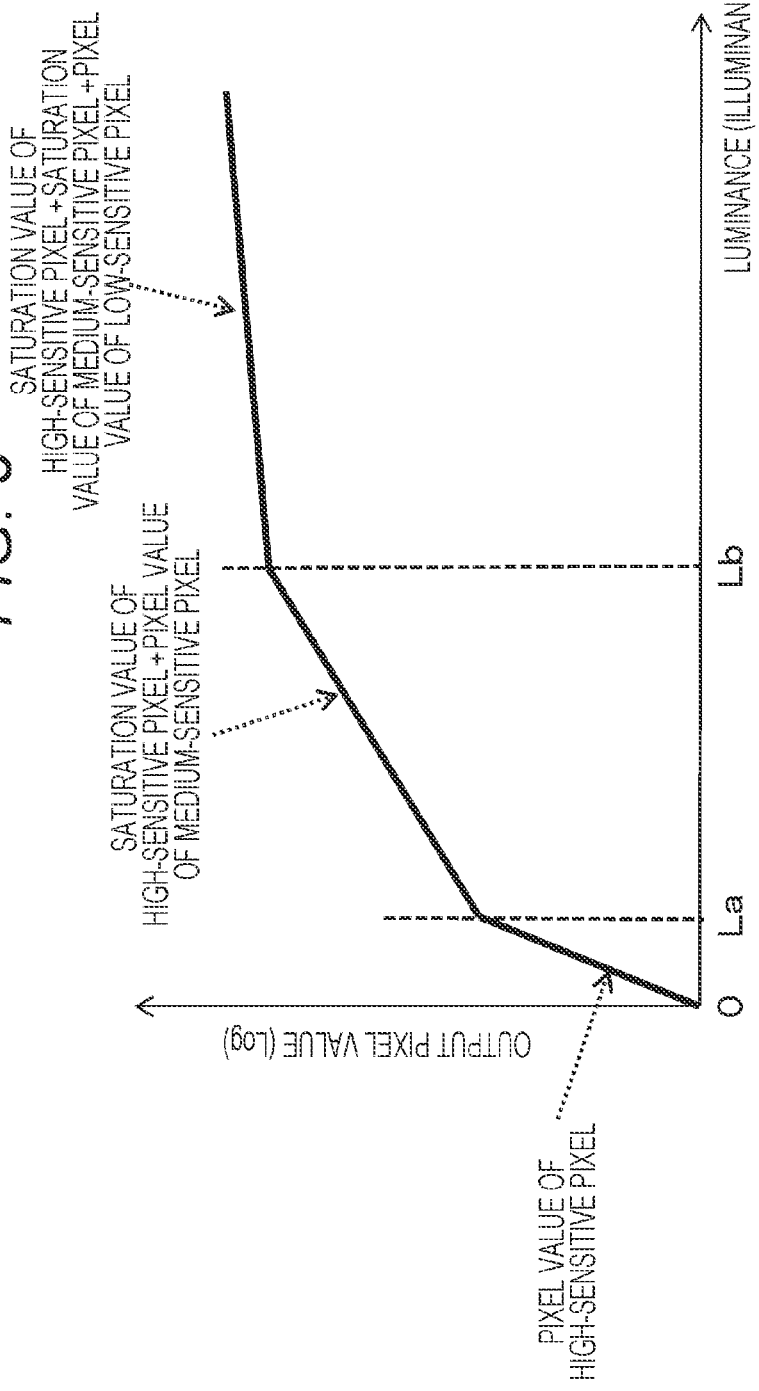

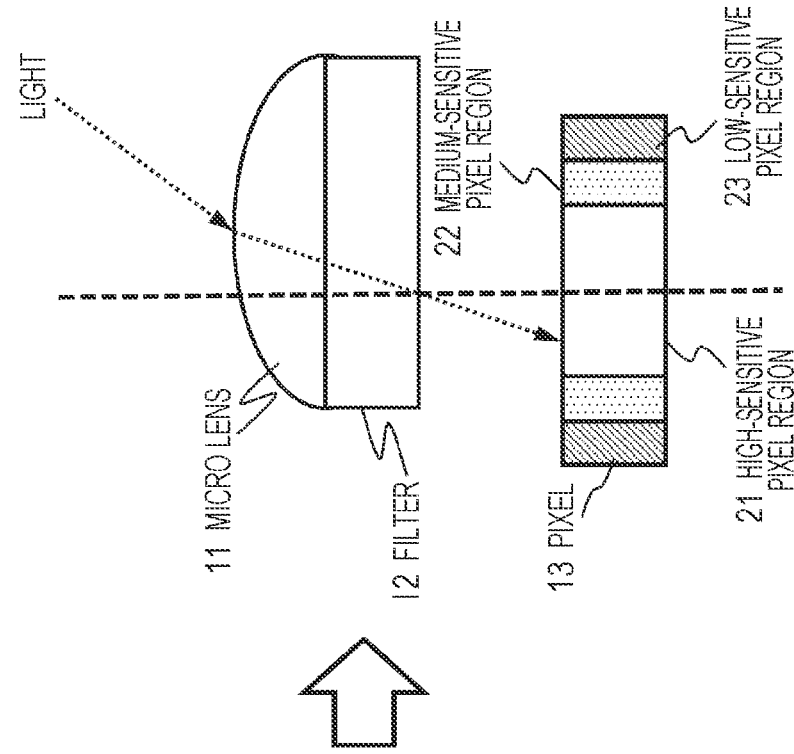
FIG. 9A  BEFORE EXIT PUPIL CORRECTION
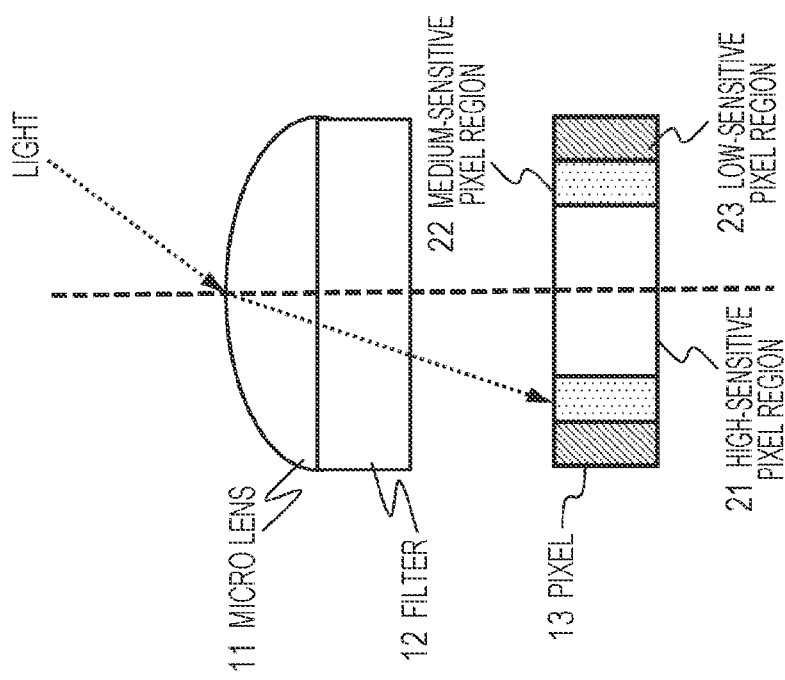
FIG. 9B  AFTER EXIT PUPIL CORRECTION

IMAGING DEVICE AND IMAGING ELEMENT

CROSS REFERENCE TO RELATED APPLICATIONS

This application is a U.S. National Phase of International Patent Application No. PCT/JP2019/027354 filed on Jul. 10, 2019, which claims priority benefit of Japanese Patent Application No. JP 2018-166339 filed in the Japan Patent Office on Sep. 5, 2018. Each of the above-referenced applications is hereby incorporated herein by reference in its entirety.

TECHNICAL FIELD

The present disclosure relates to an imaging device capable of imaging a high dynamic range image. The present disclosure also relates to an imaging device and an imaging element using micro lenses.

BACKGROUND ART

In recent years, images with a higher dynamic range have been increased due to an increase in bits of imaging elements (image sensor), and the like. The dynamic range of images can generally be expressed by a ratio between minimum luminance and maximum luminance. In high dynamic range (HDR) images known as high quality images, a contrast ratio between a maximum lightness color and a minimum lightness color reaches 10000:1 or more, for example, and thus it is possible to realistically express the real world.

HDR images can record almost all luminances in a visible range and can support a dynamic range and a color gamut equivalent to those of a human visual characteristic. It can be said that HDR images are extremely high quality images as compared with conventional images in terms of realistic expression of shades, expression of glare, and the like.

As a conventional technique which discloses an example of an imaging device that realizes a higher dynamic range, for example, Patent Document 1 (Japanese Patent Application Laid-Open No. 2004-079747) is available. In Patent Document 1, a configuration is employed in which a photosensitive region of a light-receiving element is divided into a main photosensitive region having a large area and a sub-photosensitive region having a small area, output values (pixel values) are individually acquired from these two photosensitive regions, and the pixel values of respective regions are selected or combined depending on the luminance of a subject and output.

Since the sub-photosensitive region having a small area receives a less amount of light than the main photosensitive region having a large area, the sub-photosensitive region is more difficult to saturate than the main photosensitive region even in a case where a high-luminance subject is imaged, and a highly accurate pixel value corresponding to the high-luminance subject can be output. On the other hand, in a case where a low-luminance subject is imaged, the main photosensitive region having a large area can output a more accurate pixel value than the sub-photosensitive region having a small area.

By outputting a combination of these two pixel values, it is possible to output a pixel value with a wide dynamic range of low luminance to high luminance with high accuracy.

The configuration disclosed in Patent Document 1 has a honeycomb pixel arrangement including hexagonal pixels, and each of the hexagonal pixels includes a small region at an end portion on a side of one side of the hexagon as a sub-photosensitive region, and a large region which is the rest thereof as a main photosensitive region.

However, with such a configuration, the central positions of the main photosensitive region and the sub-photosensitive region deviate from each other. As a result, positions of a subject to be imaged in the main photosensitive region and in the sub-photosensitive region deviate from each other.

A final output pixel value is calculated by a combination process of the main photosensitive region and the sub-photosensitive region, but if a subject image is different between these respective regions, originally different pixel values are combined, which makes it impossible to calculate a correct pixel value corresponding to one subject position. As a result, false colors and artifacts are more likely to occur.

CITATION LIST

Patent Document

Patent Document 1: Japanese Patent Application Laid-Open No. 2004-079747

SUMMARY OF THE INVENTION

Problems to be Solved by the Invention

The present disclosure has been made in view of the above problems, for example, and an object thereof is to provide an imaging device and an imaging element capable of generating a high quality high dynamic range image in which false colors and artifacts are prevented from occurring.

Furthermore, another object of the present disclosure is to provide an imaging device and an imaging element capable of generating a high quality high dynamic range image using micro lenses.

Solutions to Problems

A first aspect of the present disclosure is
an imaging device,
in which an individual micro lens is provided for each pixel that constitutes an imaging element,
each pixel of the imaging element includes:
a high-sensitive pixel region at a central portion of the pixel; and
a low-sensitive pixel region surrounding the high-sensitive pixel region, and
central positions of the high-sensitive pixel region and the low-sensitive pixel region coincide with each other.
Moreover, a second aspect of the present disclosure is
an imaging element,
in which an individual micro lens is provided for each pixel that constitutes the imaging element,
each pixel of the imaging element includes:
a high-sensitive pixel region at a central portion of the pixel; and
a low-sensitive pixel region surrounding the high-sensitive pixel region, and
central positions of the high-sensitive pixel region and the low-sensitive pixel region coincide with each other.

Still other objects, features and advantages of the present disclosure will become apparent from a more detailed description based on embodiments of the present disclosure to be described later and accompanying drawings. Note that the term "system" herein refers to a logical set configuration of multiple devices, and is not limited to one in which devices with respective configurations are in the same housing.

Effects of the Invention

According to a configuration of one embodiment of the present disclosure, a device is realized in which each pixel of an imaging element is divided into a plurality of pixel regions with different sensitivities of which central positions coincide with each other, and a high dynamic range image is generated on the basis of an output of each region.

Specifically, for example, an imaging element is included on which imaging light is incident through a micro lens corresponding to each pixel. Each pixel of the imaging element includes a high-sensitive pixel region at a central portion of the pixel and a low-sensitive pixel region configured at an inner peripheral portion near sides of the pixel and surrounding the high-sensitive pixel region, and has a configuration in which central positions of the high-sensitive pixel region and the low-sensitive pixel region coincide with each other. Moreover, a medium-sensitive pixel region may be included between the high-sensitive pixel region and the low-sensitive pixel region. Each region has an individual photodiode (PD), and performs electric charge output corresponding to the amount of received light individually on a per region basis, and a high dynamic range image is generated by combing these outputs.

By these processes, the device is realized in which each pixel of an imaging element is divided into a plurality of pixel regions with different sensitivities of which central positions coincide with each other, and a high dynamic range image is generated on the basis of an output of each region.

Note that the effects described herein are merely examples and are not limited, and there may be additional effects.

BRIEF DESCRIPTION OF DRAWINGS

FIG. 7 is a diagram explaining an example of output of a pixel value of the pixel of the imaging element of the present disclosure.

FIG. 8 is a diagram explaining an example of output of a pixel value of the pixel of the imaging element of the present disclosure.

FIGS. 9A and 9B are diagrams explaining exit pupil correction.

MODE FOR CARRYING OUT THE INVENTION

Hereinafter, details of an imaging device and an imaging element of the present disclosure will be described with reference to the drawings. Note that the description will be given in accordance with the following items.
1. Configuration of Imaging Element Including Micro lenses
2. Example Configuration of Pixel of Imaging Device of Present Disclosure
3. Pixel Value Calculation Process in Imaging Device of Present Disclosure
4. Exit Pupil Correction
5. Other Embodiments
6. Example of Overall Configuration of Imaging Device
7. Summary of Configuration of Present Disclosure 1. Configuration of Imaging Element Including Micro Lenses First, a configuration of an imaging element including micro lenses will be described with reference to FIGS. 1A and 1B and a subsequent figure.

An imaging device of the present disclosure has a configuration in which a micro lens (ML) is arranged on each pixel of an imaging element, and respective pixels are configured such that light is incident through individual micro lenses.

Figure 1:
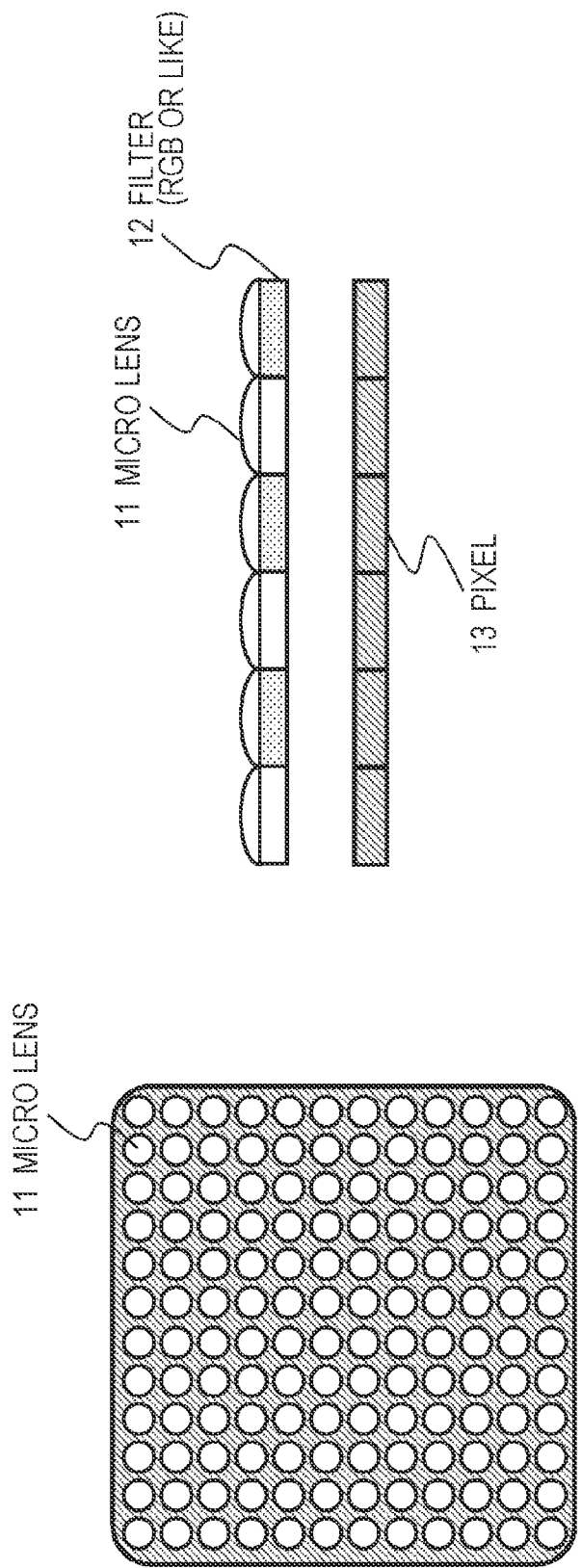
FIGS. 1A and 1B are views explaining an example configuration of an imaging device including micro lenses.

FIG. 1A illustrates a plan view (top view) and FIG. 1B a cross-sectional view of the imaging element. As illustrated in FIG. 1A the plan view (top view), small lenses, that is, micro lenses 11 are arranged on an upper surface of the imaging element.

As illustrated in (b) the cross-sectional view, each pixel 13 constituting the imaging element is irradiated with light incident through the micro lenses 11 via a filter 12 including, for example, a color filter of R, G, and B, or the like, and imaging is performed. Each pixel accumulates an electric charge depending on the amount of light, and the accumulated electric charge is output to a signal processing unit at a subsequent stage to generate an output image.

Figure 2:
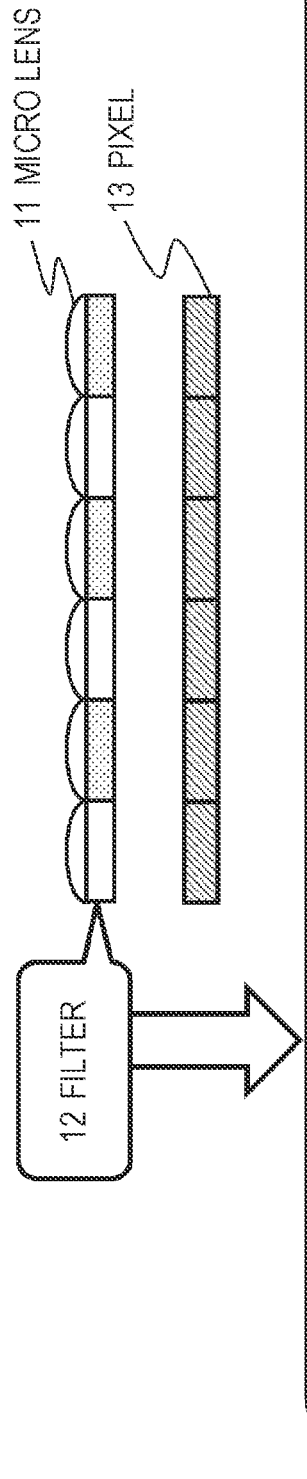
FIGS. 2A, 2B, and 2C are diagrams explaining example configurations of a filter.

FIGS. 2A, 2B, and 2C are diagrams illustrating examples of the filter 12. Various filters can be applied as the filter 12. For example, an RGB array illustrated in FIG. 2A is a so-called Bayer array, which is a filter used for imaging a general color image. (FIG. 2B) An RGBW array is a filter including each of R, G, and B filters and a white (W) filter. The W filter transmits light of all wavelengths of R, G, and B, and is used when imaging an image with a larger amount of light. (FIG. 2C) An RGBIR array is a filter including each of R, G, and B filters and an infrared (IR) filter. The IR filter transmits infrared and is used for imaging infrared. Note that all of these filters are conventionally known filters.

2. Example Configuration of Pixel of Imaging Device of Present Disclosure

Next, a pixel configuration of the imaging element, which is a feature of the imaging device of the present disclosure, will be described.

Figure 3:
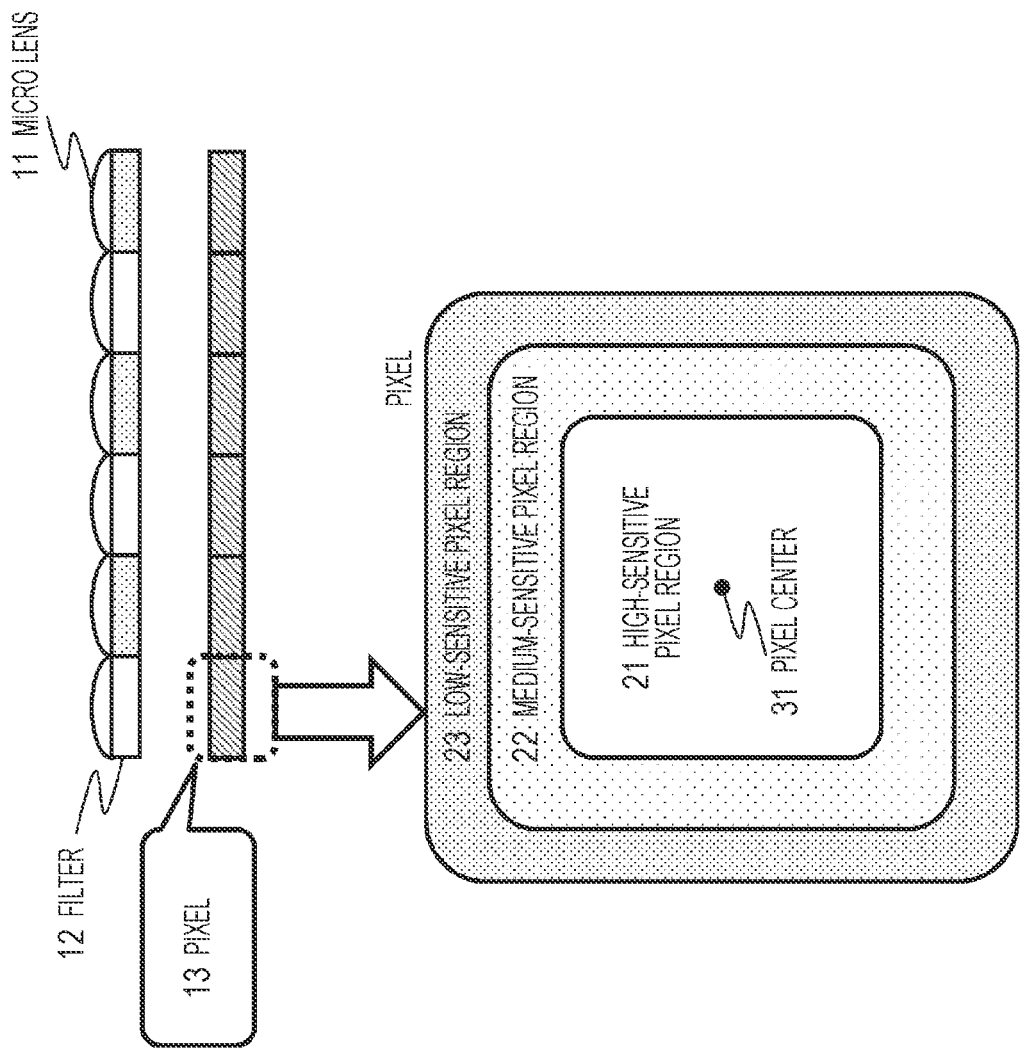
FIG. 3 is a diagram explaining an example configuration of a pixel.

FIG. 3 is a diagram illustrating an example of the pixel configuration of the imaging element of the imaging device of the present disclosure.

FIG. 3 illustrates an enlarged view of one pixel.

As illustrated in FIG. 3, one pixel is segmented into the following three pixel regions.

(1) High-sensitive pixel region 21
(2) Medium-sensitive pixel region 22
(3) Low-sensitive pixel region 23

The high-sensitive pixel region 21 is configured at a central portion of the pixel, the low-sensitive pixel region 23 is configured at an inner peripheral portion near sides of the pixel and surrounding the high-sensitive pixel region 21 and the medium-sensitive pixel region 22, and the medium-sensitive pixel region 22 is configured between the high-sensitive pixel region 21 and the low-sensitive pixel region 23.

The centers of these three pixel regions are all located at a central position of the pixel as a whole, that is, a position of a pixel center 31 illustrated in the figure, and the central positions of all the regions coincide with one another.

Light through one micro lens is incident on the pixel. More light is incident on the high-sensitive pixel region 21 which is large and located at the central portion of the pixel, and the irradiation light is weakened toward a peripheral portion thereof. As a result, the high-sensitive pixel region 21 located at the center can receive the amount of incident light which more correctly reflects light from a subject, and can generate an output which maintains high sensitivity. However, for example, in a case where the luminance of the subject is high and the amount of incident light is large, saturation is likely to occur.

On the other hand, in the peripheral portion of the pixel, the amount of light incident through the micro lens is lower than that in the central portion. As a result, the low-sensitive pixel region 23 has an advantage that saturation is less likely to occur even in a case where the luminance of the subject is high, for example.

The medium-sensitive pixel region 22 configured between the high-sensitive pixel region 21 and the low-sensitive pixel region 23 has an intermediate characteristic between the characteristics of the high-sensitive pixel region 21 and the low-sensitive pixel region 23.

The imaging device of the present disclosure individually acquires output values (pixel values) from these three pixel regions with different sensitivities, changes the form of combination of respective outputs depending on the luminance of the subject, and generates and outputs a final output value, that is, a pixel value.

By outputting a combination of these three pixel values, it is possible to output a pixel value with a wide dynamic range of low luminance to high luminance as a highly accurate pixel value.

Note that a specific example of a pixel value calculation process will be described in detail later.

One of the features of the pixel configuration of the present disclosure is that regarding the three pixel regions with different sensitivities, that is, the high-sensitive pixel region 21, the medium-sensitive pixel region 22, and the low-sensitive pixel region 23, the centers of these three pixel regions coincide with one another.

The centers of these three pixel regions are all located at the central position of the pixel as a whole, that is, the position of the pixel center 31 illustrated in the figure, and the central positions of all the regions coincide with one another.

As a result, the positions of the subject to be imaged coincide with one another in all three pixel regions.

A final output pixel value is any one of the pixel values of the three pixel regions or is calculated by a combination process, but in the configuration of the present disclosure, the centers of the respective sensitive pixel regions coincide with one another, and all the sensitive pixel regions can image images with the same subject position. Therefore, regarding any one of the pixel values of the three pixel regions or the pixel value calculated by the combination process, every one thereof is a pixel value corresponding to one subject position. As a result, a high quality image can be output with no occurrence of false colors and artifacts.

Figure 4:
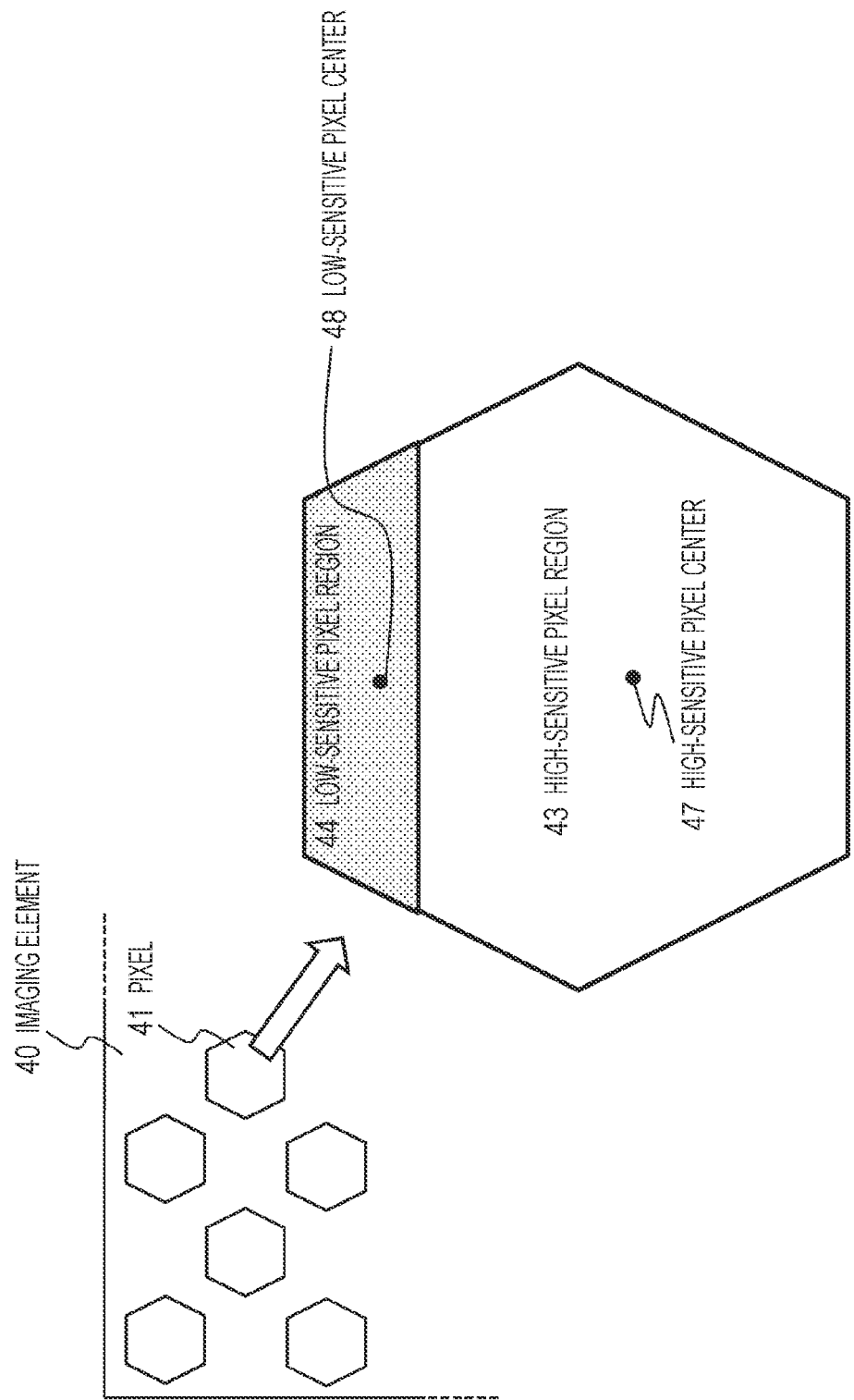
FIG. 4 is a diagram explaining an example configuration of a pixel of a conventional technique.

As a comparative example with the pixel configuration of the present disclosure, FIG. 4 illustrates an example of a divided pixel configuration of a hexagonal pixel described in Patent Document 1 (Japanese Patent Application Laid-Open No. 2004-079747) described above as the conventional technique.

An imaging element 40 described in Patent Document 1 includes pixels 41 each having a hexagonal shape. As illustrated in FIG. 4, the pixel 41 includes a small region which is a part of an end portion of the hexagonal pixel as a low-sensitive pixel region 44 (sub-photosensitive region), and a large region which is the rest thereof as a high-sensitive pixel region 43 (main photosensitive region).

However, in this configuration, a central position of the high-sensitive pixel region 43 (main photosensitive region) is a position of a high-sensitive pixel center 47 illustrated in the figure, and a central position of the low-sensitive pixel region (sub-photosensitive region) is a position of a low-sensitive pixel center 48 illustrated in the figure. That is, the central positions of the high-sensitive pixel region 43 (main photosensitive region) and the low-sensitive pixel region 44 (sub-photosensitive region) are positions different from each other. As a result, there arises a problem that positions of the subject to be imaged in the high-sensitive pixel region 43 (main photosensitive region) and in the low-sensitive pixel region 44 (sub-photosensitive region) deviate from each other.

The final output pixel value is calculated by a combination process of the main photosensitive region and the sub-photosensitive region, but if these respective regions correspond to images of subject regions different from each other as described with reference to FIG. 4, originally different pixel values are combined. As a result, it is not possible to calculate a pixel value corresponding to one correct subject position, and false colors and artifacts are likely to occur.

On the other hand, in the pixels in the imaging element of the imaging device of the present disclosure, regarding the three pixel regions with different sensitivities, that is, the high-sensitive pixel region 21, the medium-sensitive pixel region 22, and the low-sensitive pixel region 23, the centers of these three pixel regions coincide with one another, and therefore, the positions of the subject to be imaged coincide with one another in all three pixel regions. As a result, it is possible to output a high quality image with no occurrence of false colors and artifacts.

Next, a cross-sectional configuration of the imaging element of the present disclosure and an example of incident light will be described with reference to FIG. 5.

Figure 5:
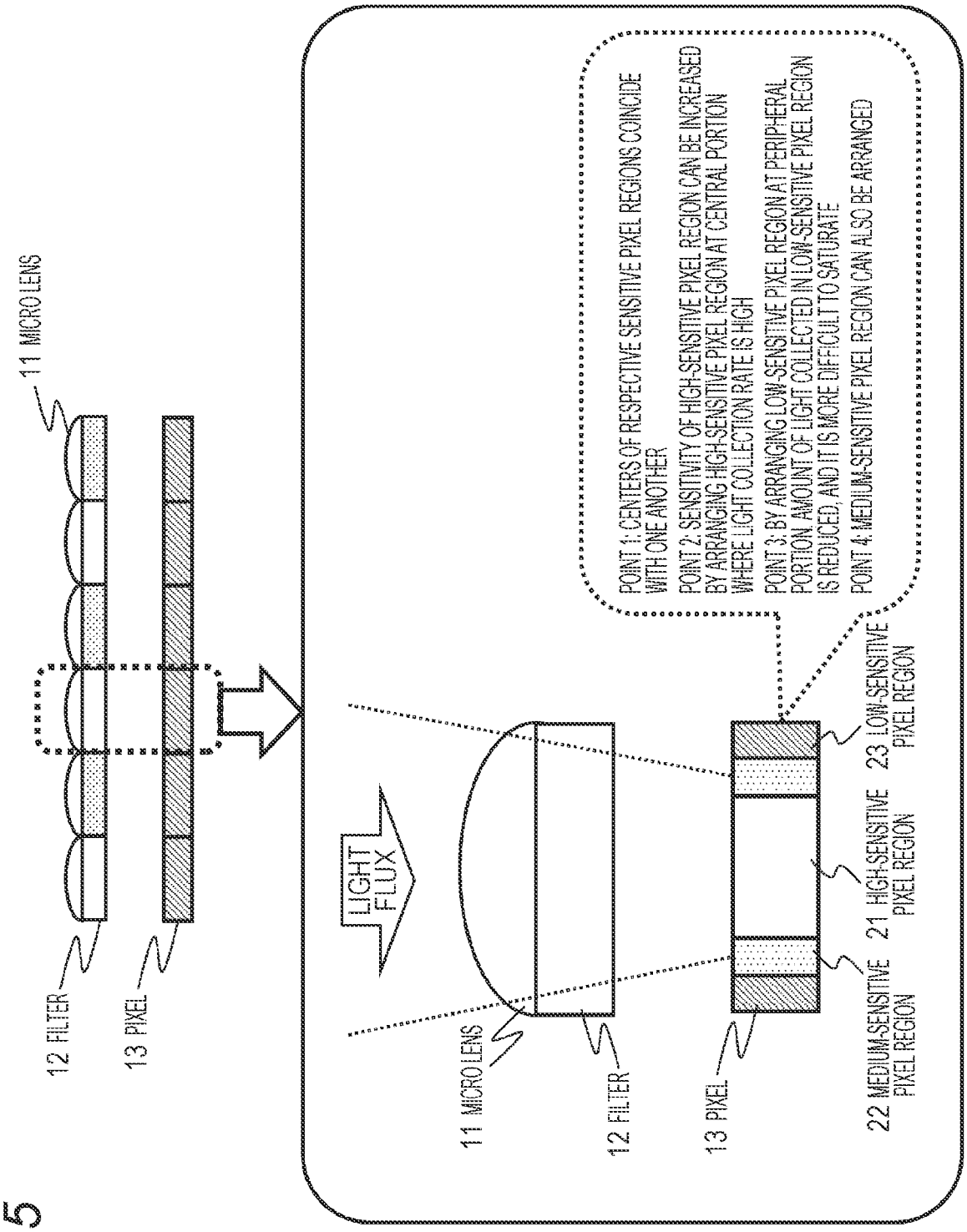
FIG. 5 is a diagram explaining a configuration of incident light with respect to the pixel and a configuration of the pixel of an imaging element of the present disclosure.

A lower portion of FIG. 5 illustrates cross-sectional configurations of one micro lens 11, the filter 12, and one pixel 13.

The pixel 13 is a pixel having the three sensitive regions described above with reference to FIG. 3. That is, the high-sensitive pixel region 21 is configured at the central portion, the medium-sensitive pixel region 22 is configured at a periphery thereof, and the low-sensitive pixel region 23 is configured at an outermost periphery.

Light as subject imaging light passes through the filter 12 through the micro lens 11 and is incident on the pixel 13.

The light is collected by the micro lens 11, is mainly collected in the central portion of the pixel, and is incident on the pixel.

As illustrated in the figure, the pixel 13 of the present disclosure has the following features (points).

(Point 1) The centers of respective sensitive pixel regions coincide with one another.

(Point 2) The sensitivity of the high-sensitive pixel region can be increased by arranging the high-sensitive pixel region at the central portion where a light collection rate is high.

(Point 3) By arranging the low-sensitive pixel region at the peripheral portion, the amount of light collected in the low-sensitive pixel region is reduced, and it is more difficult to saturate.

(Point 4) The medium-sensitive pixel region can also be arranged.

These features (points) will be described.

(Point 1) is that a configuration is employed in which the centers of the respective sensitive pixel regions coincide with one another.

With this configuration, it is possible to cause the positions of the subject to be imaged in the respective sensitive pixels to coincide with one another.

(Point 2) is that a higher-sensitive image can be imaged in the high-sensitive pixel region by arranging the high-sensitive pixel region at the central portion where a light collection rate is high.

(Point 3) is that by arranging the low-sensitive pixel region at the peripheral portion, the amount of light collected in the low-sensitive pixel region is reduced, and it is more difficult to saturate. As a result, it is possible to output a pixel value which does not reach a saturation level and is correct enough to reflect the luminance of the subject even when a high-luminance image is imaged.

(Point 4) is that the medium-sensitive pixel region can also be arranged. That is, it is possible to output pixel value data having an intermediate characteristic between the high-sensitive pixel region and the low-sensitive pixel region by arranging the medium-sensitive pixel region as well.

The pixels of the imaging device of the present disclosure have the above-described features.

In the imaging device of the present disclosure, the final output pixel value is calculated by combining the pixel values of the three pixel regions with different sensitivities. This process makes it possible to output a high dynamic range image which correctly reproduces a luminance level of low luminance to high luminance.

3. Pixel Value Calculation Process in Imaging Device of Present Disclosure

Next, an example of a pixel value calculation process in the imaging device of the present disclosure will be described with reference to FIG. 6 and subsequent figures.

As described with reference to FIGS. 3 and 5, the pixels of the imaging element of the imaging device of the present disclosure have the following three pixel regions.

(1) High-sensitive pixel region 21
(2) Medium-sensitive pixel region 22
(3) Low-sensitive pixel region 23

The central positions of these three pixel regions are all set at the central portion of the pixel and coincide with one another.

In the configuration of the present disclosure, electric charges are individually accumulated depending on the amount of incident light in the above three pixel regions with different sensitivities, but the number of output values from one pixel is one, and one pixel value is finally calculated and output on the basis of accumulated electric charges of each of the three pixel regions with different sensitivities.

A specific pixel value output configuration will be described with reference to FIG. 6 and subsequent figures.

Figure 6:
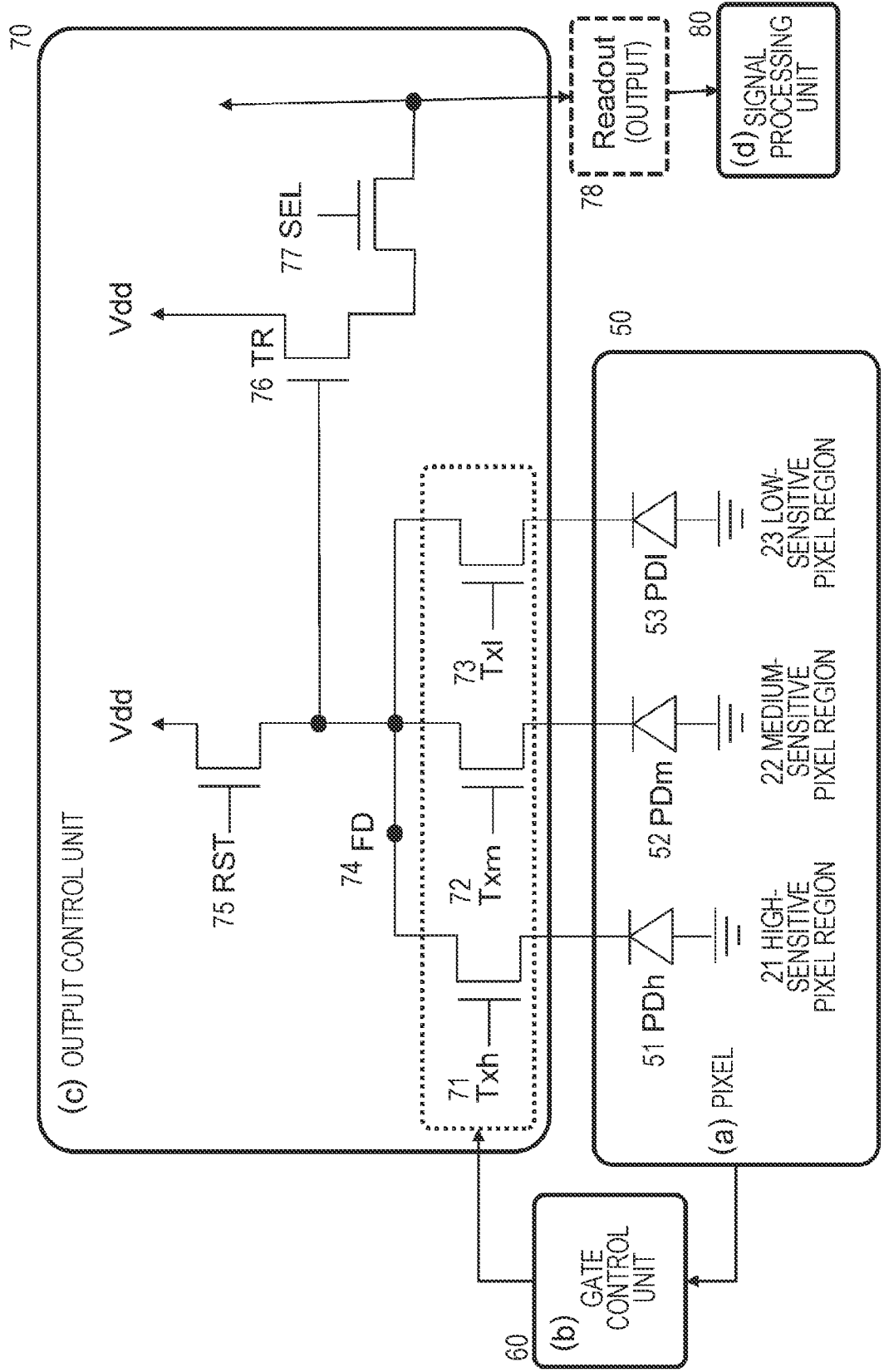
FIG. 6 is a diagram explaining an example of output of a pixel value of the pixel of the imaging element of the present disclosure.

FIG. 6 is a diagram illustrating a detailed configuration example of an output control unit 70 and the like. The output control unit 70 outputs a final one pixel value on the basis of the amount of accumulated electric charges in the above three pixel regions with different sensitivities.

FIG. 6 illustrates the following components of the imaging device.

(a) High-sensitive pixel region 21, medium-sensitive pixel region 22, low-sensitive pixel region 23, and pixel 50 including these three pixel regions
(b) Gate control unit 60
(c) Output control unit 70
(d) Signal processing unit 80

An individual photodiode (PD) is attached to each of the three pixel regions, i.e., the high-sensitive pixel region 21, the medium-sensitive pixel region 22, and the low-sensitive pixel region 23 of the pixel 50, and outputs an electric charge depending on the amount of incident light in each pixel region.

A PDh 51 outputs an electric charge depending on the amount of incident light in the high-sensitive pixel region 21.

A PDm 52 outputs an electric charge depending on the amount of incident light in the medium-sensitive pixel region 22.

A PDl 53 outputs an electric charge depending on the amount of incident light in the low-sensitive pixel region 23.

The outputs of the photodiodes (PDs) 51 to 53 are input to a floating diffusion (FD) 74 respectively via individual gate circuits Txh 71, Txn 72, and Txl 73 included in the output control unit 70. Note that the floating diffusion (FD) 74 is reset by a reset circuit (RST) 75 as a pre-process of an imaging process.

Electric charges output from the photodiodes (PDs) 51 to 53 are input to the floating diffusion (FD) 74 respectively via the gate circuits Txh 71, Txn 72, and Txl 73 by imaging after the reset process.

The floating diffusion (FD) 74 converts the electric charges based on the outputs of the photodiodes (PDs) 51 to 53 into a voltage, operates a transistor (TR) 76 on the basis of a voltage value, and outputs an output value (Readout) 78 via a selector circuit (SEL) 77. The output value (Readout) 78 is input to the signal processing unit 80, and combined with pixel values of other pixels to generate one image.

Note that the output value (Readout) 78 is an output depending on the electric charges supplied to the floating diffusion (FD) 74.

Here, the gate circuits Txh 71, Txn 72, and Txl 73 are ON/OFF-controlled by the gate control unit 60.

FIG. 7 is a diagram illustrating an example of an ON/OFF control setting of each gate by the gate control unit 60.

The gate control unit 60 detects whether or not each of the high-sensitive pixel region 21, the medium-sensitive pixel region 22, and the low-sensitive pixel region 23 constituting the pixel 50 reaches a saturation level, and performs control to change the ON/OFF setting of each of the gate circuits Txh 71, Txn 72, and Txl 73 using the saturation level of each pixel region as a threshold.

For example, in a case where a pixel value level is (L1) 0 to the high-sensitive pixel region saturation level,
(1) the gate circuit Txh for the high-sensitive pixel region 21 is ON,
(2) the gate circuit Txm for the medium-sensitive pixel region 22 is ON, and
(3) the gate circuit Txl for the low-sensitive pixel region 23 is ON.

As described above, all the gate circuits for the high-sensitive pixel region 21, the medium-sensitive pixel region 22, and the low-sensitive pixel region 23 are turned on, and a pixel value obtained when an effective pixel area is maximized is set as an output pixel value.

Furthermore, in a case where the pixel value level is (L2) the high-sensitive pixel region saturation level to the medium-sensitive pixel region saturation level,
(1) the gate circuit Txh for the high-sensitive pixel region 21 is OFF (saturation value),
(2) the gate circuit Txm for the medium-sensitive pixel region 22 is ON, and
(3) the gate circuit Txl for the low-sensitive pixel region 23 is ON.

As described above, the gate circuits for the medium-sensitive pixel region 22 and the low-sensitive pixel region 23 are turned on, and a combination result (value obtained by addition) of a pixel value of the medium-sensitive pixel region 22 and a pixel value of the low-sensitive pixel region 23 is set as an output. Note that the high-sensitive pixel region 21 is saturated, and thus the pixel value is constant. Here, two values of the medium and low sensitivities are added and output. The amount of photons which have entered through the micro lens and have not been absorbed in the high sensitivity is distributed to the medium and low sensitive pixels.

Moreover, for example, in a case where the pixel value level is (L3) the medium-sensitive pixel region saturation level to the low-sensitive pixel saturation level,
(1) the gate circuit Txh for the high-sensitive pixel region 21 is OFF (saturation value),
(2) the gate circuit Txm for the medium-sensitive pixel region 22 is OFF (saturation value), and
(3) the gate circuit Txl for the low-sensitive pixel region 23 is ON.

As described above, the gate circuit for the low-sensitive pixel region 23 is turned on, and a pixel value of the low-sensitive pixel region 23 is set as an output pixel value. Note that photons which have not been absorbed in the high and medium sensitivities are input to the low sensitive pixel. The low-sensitive pixel region 23 is located at the outermost portion of the pixel, is a region where light collection by the micro lens is poor, and is difficult to saturate. The high and medium sensitive pixels are each saturated, and thus a constant value is output.

As a result of the control of these gate circuits, the output value (Readout) of the output control unit 70, that is, the pixel value changes as illustrated in FIG. 8 corresponding to the luminance of the subject.

The graph illustrated in FIG. 8 illustrates an output pixel value (Log) associated with a change in luminance (illuminance), with the horizontal axis representing the luminance (illuminance) and the vertical axis representing the output pixel value (Log).

The graph is configured by concatenating outputs which are different depending on the luminance.

(1) In a case where the luminance (illuminance) is 0 to the high-sensitive pixel saturation level,
only a pixel value of the high-sensitive pixel region 21 is selected and output. (2) In a case where the luminance (illuminance) is the high-sensitive pixel saturation level to the medium-sensitive pixel saturation level,
a value obtained by addition of a pixel value (saturation value) of the high-sensitive pixel region 21 and a pixel value of the medium-sensitive pixel is output. (3) In a case where the luminance (illuminance) is the medium-sensitive pixel saturation level to the low-sensitive pixel saturation level,
a value obtained by addition of the pixel value (saturation value) of the high-sensitive pixel region 21, a pixel value (saturation value) of the medium-sensitive pixel, and a pixel value of the low-sensitive pixel is output.

Note that the sensitivity of the pixel of the imaging element is about 60 dB=1000 times.

It is possible to reproduce a pixel value of 60 dB×3=180 dB by the combination process of the pixel values of the three pixel regions.

Specifically, each of the following outputs can be obtained by the combination process of the pixel values of three pixels, for example.

(1) Only the high-sensitive pixel region 21 is used=the pixel value of the high-sensitive pixel region 21=0.01 to 10 (lux (Lx))
(2) The high-sensitive pixel region 21 and the medium-sensitive pixel region 22 are used=10 to 10,000 (lux (Lx))
(3) The high-sensitive pixel region 21, the medium-sensitive pixel region 22, and the low-sensitive pixel region 23 are used=10,000 to 10,000,000 (lux (Lx))

The luminance at the upper right end of the graph illustrated in FIG. 8 is a luminance level corresponding to 10,000,000 (lux (Lx)).

As described above, the imaging device of the present disclosure can generate and output an image with a wide dynamic range of low luminance to high luminance by dividing one pixel into a plurality of pixel regions with different sensitivities and controlling an output value depending on the luminance.

Moreover, as described above, all of the three pixel regions with different sensitivities included in the pixel of the present disclosure are configured such that the central positions are located at the central portion of the pixel as a whole, and in a case where one pixel value is calculated by combining outputs of respective pixels, all positions of the subject corresponding to light incident on the pixel regions with respective sensitivities coincide with one another. Therefore, the combination process of the pixel values of a plurality of pixel regions with different sensitivities results in a pixel value of the same subject position, and it is possible to output a high quality image with no occurrence of color shift, artifacts, and the like.

4. Exit Pupil Correction

Next, as one example configuration of the imaging device of the present disclosure, an example configuration of the imaging device in consideration of exit pupil correction will be described.

The imaging element of the present disclosure has a configuration in which a micro lens is arranged on each pixel as described above with reference to FIGS. 1A and 1B and one other figure. In such an imaging element, incident light is perpendicular to a screen at the central portion of the imaging element, and toward a peripheral side thereof, the incident light changes from perpendicular light to oblique light with an angle. That is, an incident angle of light on a surface of a pixel of the imaging element changes depending on a position of the pixel.

If the incident angle of the incident light changes depending on the pixel position as described above, there occurs a change in the intensity and the quality of input light between the central portion and the peripheral portion of the imaging element, and the uniformity of the image as a whole is lost. Exit pupil correction is performed as correction for reducing the change in the input light for each pixel due to the change in the incident angle of the light depending on the position of the imaging element as described above.

A specific process of the exit pupil correction is a process of arranging the center of the micro lens and the center of the pixel so that deviation therebetween is larger at a position closer to the peripheral portion of the imaging element.

This process makes it possible to make oblique incident light generated in the peripheral portion of the imaging element incident on a position close to the center of a light-receiving pixel.

A specific example of the exit pupil correction will be described with reference to FIGS. 9A and 9B.

FIGS. 9A and 9B are both diagrams illustrating a cross-sectional configuration of one pixel in the peripheral portion of the imaging element.

FIG. 9A is an example of incident light in a case where the exit pupil correction is not performed.

In the configuration illustrated in FIG. 9A, all of the centers of the micro lens 11, the filter 12, and the pixel 13 coincide with one another.

As described above, even the incident light perpendicular to the screen at the central portion of the imaging element changes to oblique light at the peripheral side thereof. The light illustrated in the figure illustrates the oblique light.

As illustrated in FIG. 9A, the oblique light is incident on and passes through the micro lens 11, and a position where the oblique light is incident on the pixel 13 is a region which significantly deviates from the center of the pixel 13.

If light is incident on a region at an end portion of the pixel as described above, light with higher intensity may be incident on the medium-sensitive pixel region 22 or the low-sensitive pixel region 23 than on the high-sensitive pixel region 21.

If such a state occurs, it may become not possible to calculate and output a highly accurate pixel value even if the pixel value calculation described above with reference to FIG. 8 is performed.

In order to prevent such a situation, the exit pupil correction is performed. That is, the center of the micro lens and the center of the pixel are arranged so that deviation therebetween becomes larger toward the peripheral portion of the imaging element.

FIG. 9B is an example of a pixel setting after executing the exit pupil correction.

In the configuration illustrated in FIG. 9B, the centers of the micro lens 11 and the filter 12 and the center of the pixel 13 are set to deviate from each other.

By setting the centers of the micro lens 11 and the pixel 13 to deviate from each other as described above, in a case where oblique light is incident on and passes through the micro lens 11 and is incident on the pixel 13, an incident position of the light can be changed to a position closer to the center of the pixel 13.

Such a process makes it possible to control the position of the incident light with respect to each pixel to be set to substantially a central position of each pixel in the entire imaging element, and the amount of change in the incident light depending on the pixel position can be reduced.

By performing the exit pupil correction, incident forms of light on all the pixels included in the imaging element is made uniform. As a result, it is possible to generate and output an image including a highly accurate pixel value with a wide dynamic range of low luminance to high luminance by a calculation process of the output pixel value described above with reference to FIGS. 6 to 8.

5. Other Embodiments

Next, other embodiments will be described with reference to FIG. 10 and subsequent figures.

The following embodiments will be described in sequence.

(1) Example in which segmented regions of pixel are changed
(2) Example configuration of detecting defective pixel
(3) Example configuration to which sensing function using infrared (IR) is applied
(4) Configuration of support base in laminated configuration (1) Example in which Segmented Regions of Pixel are Changed First, an example in which segmented regions of the pixel are changed will be described.

The pixel configuration described above with reference to FIG. 3 is a configuration in which one pixel is segmented into the following three pixel regions.

(1) High-sensitive pixel region 21
(2) Medium-sensitive pixel region 22
(3) Low-sensitive pixel region 23

The high-sensitive pixel region 21 is configured at the central portion of the pixel, the low-sensitive pixel region 23 is configured at the peripheral portion of the pixel, and the medium-sensitive pixel region 22 is configured between the high-sensitive pixel region 21 and the low-sensitive pixel region 23.

The centers of these three pixel regions are all located at the central position of the pixel as a whole, that is, the position of the pixel center 31 illustrated in FIG. 3, and coincide with one another.

As an example of a setting of the segmented regions of one pixel, various configurations other than the configuration illustrated in FIG. 3 can be employed.

Figure 10:
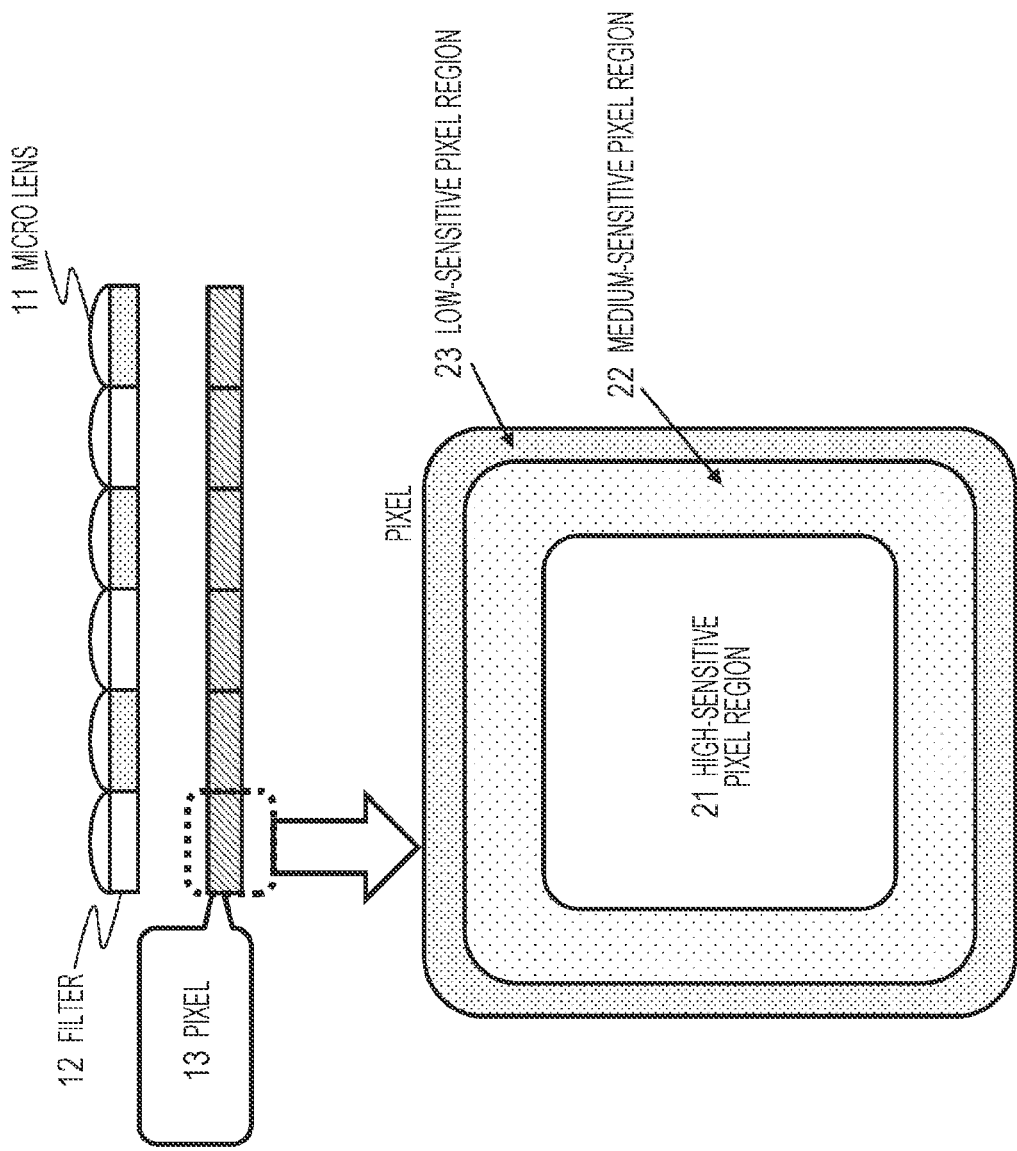
FIG. 10 is a diagram explaining an example configuration of the pixel of the imaging element of the present disclosure.

A pixel configuration illustrated in FIG. 10 is a configuration in which one pixel is segmented into the following three pixel regions, similarly to the pixel described above with reference to FIG. 3.

(1) High-sensitive pixel region 21
(2) Medium-sensitive pixel region 22
(3) Low-sensitive pixel region 23

However, the areas of the pixel regions with respective sensitivities illustrated in FIG. 10 are set as follows.

High-sensitive pixel region 21>medium-sensitive pixel region 22>low-sensitive pixel region 23

That is, the high-sensitive pixel region 21 has the largest area, the medium-sensitive pixel region 22 has the second largest area, and the low-sensitive pixel region 23 has the smallest area.

With such a setting, the amount of light received in respective sensitive pixel regions can be set as follows.

High-sensitive pixel region 21>medium-sensitive pixel region 22>low-sensitive pixel region 23

Figure 11:
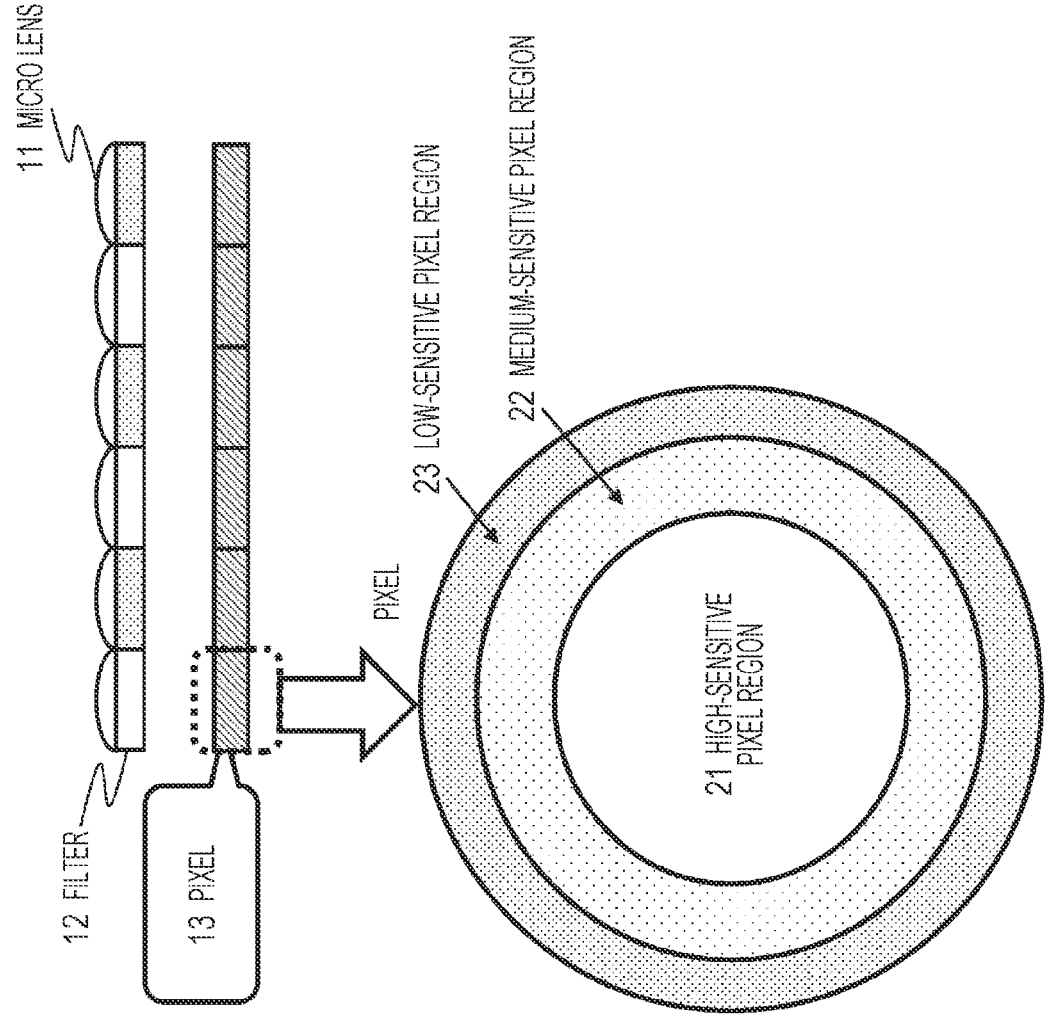
FIG. 11 is a diagram explaining an example configuration of the pixel of the imaging element of the present disclosure.

An example illustrated in FIG. 11 is an example in which the pixel regions are circular. Similar to the configuration described above with reference to FIG. 3, a configuration is employed in which one pixel is segmented into the following three pixel regions.

(1) High-sensitive pixel region 21
(2) Medium-sensitive pixel region 22
(3) Low-sensitive pixel region 23

The example includes a circular region at a central portion as the high-sensitive pixel region 21, an annular region at an outermost periphery as the low-sensitive pixel region 23, and the medium-sensitive pixel region 22 configured therebetween.

Such a configuration may be employed.

Figure 12:
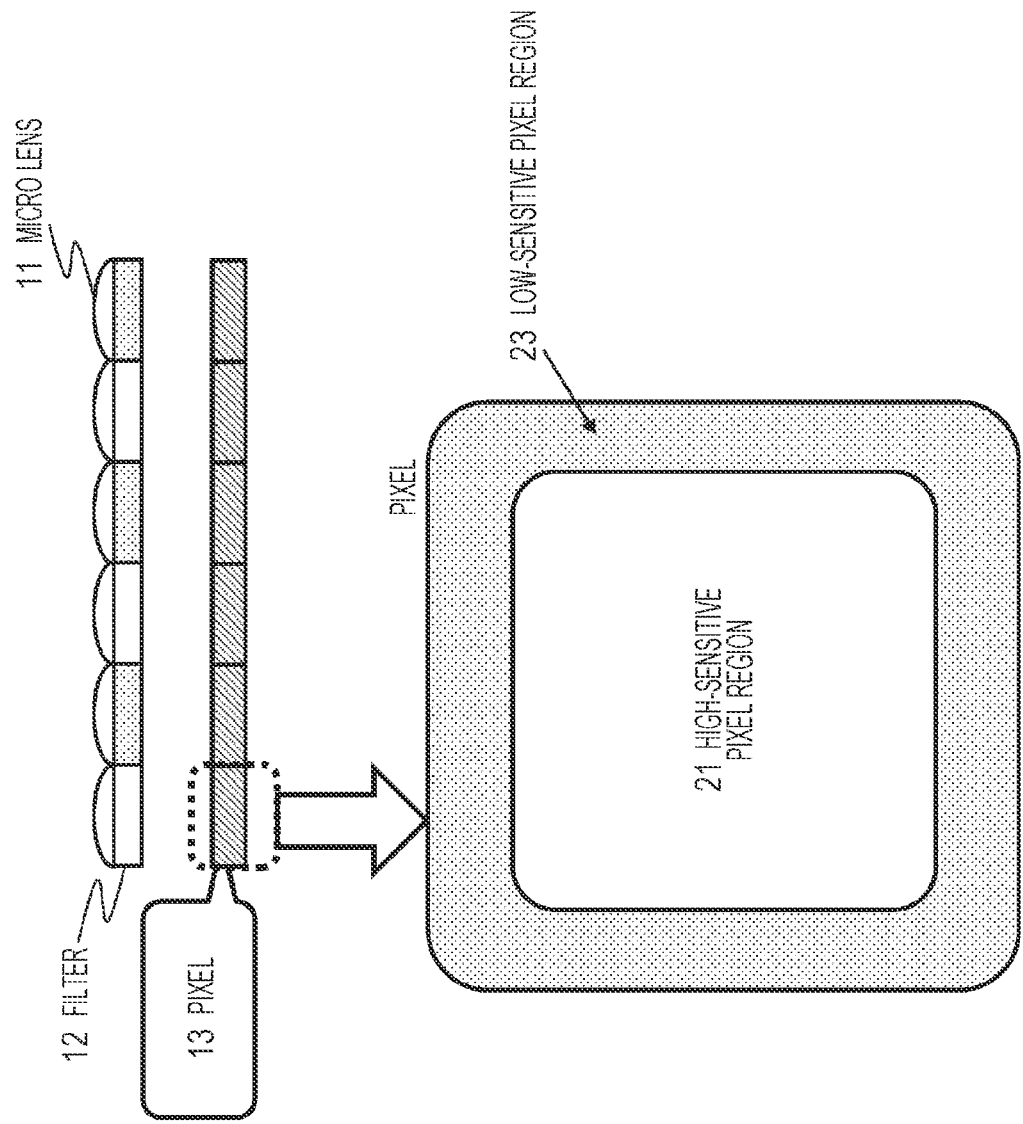
FIG. 12 is a diagram explaining an example configuration of the pixel of the imaging element of the present disclosure.

In an example illustrated in FIG. 12, a configuration is employed in which one pixel is segmented into the following two pixel regions.

(1) High-sensitive pixel region 21
(2) Low-sensitive pixel region 23

The example includes no medium-sensitive pixel region, but a pixel value with a wide dynamic range can be output by combining two pixel values, i.e., a pixel value of the high-sensitive pixel region and a pixel value of the low-sensitive pixel region.

(2) Example Configuration of Detecting Defective Pixel

Next, an example configuration of detecting a defective pixel will be described. The pixels of the imaging device of the present disclosure have a configuration in which one pixel is segmented into the following three pixel regions, as described above with reference to FIG. 3 and other figures.

(1) High-sensitive pixel region 21
(2) Medium-sensitive pixel region 22
(3) Low-sensitive pixel region 23

The pixel centers of these pixels coincide with one another, and furthermore, the sensitivity of each sensitive pixel is basically set to a fixed value designed in advance. Sensitivity information of each sensitive pixel is stored, for example, in a memory in the imaging device, and detection is performed at a time of actual imaging as to whether or not an outlier has occurred. If such an outlier is detected, it is determined as a failure. In the configuration including a pixel having divided regions corresponding to sensitivities of the present disclosure, it is possible to detect such defective pixels on a per region basis.

(3) Example Configuration to which Sensing Function Using Infrared (Ir) is Applied In the filter configurations described above with reference to FIGS. 2A, 2B, and 2C, the RGBIR filter described with reference to FIG. 2C has a configuration capable of imaging infrared.

On the other hand, the pixel configuration of the imaging device of the present disclosure includes the following three pixel regions with different sensitivities.

(1) High-sensitive pixel region 21
(2) Medium-sensitive pixel region 22
(3) Low-sensitive pixel region 23

Since light intensity of infrared is generally weak, in a case where a sensing process is performed using an RGBIR filter, it is possible to selectively use a sensitive pixel region on a per pixel basis in IR pixels, for example, to use only an output value of the high-sensitive pixel region 21 without referring to an output of the medium-sensitive pixel region 22 or the low-sensitive pixel region 23.

Furthermore, in a configuration using an RGBW filter as a filter, although the amount of incident light of W pixel is larger than that of other pixels, the low-sensitive pixel region is unlikely to be saturated, so that there is an increased possibility that an effective pixel value can be output.

(4) Configuration of Support Base in Laminated Configuration

The configurations of the micro lens 11, the filter 12, and the pixel 13 illustrated in FIGS. 1A and 1B of the present disclosure can be integrally produced in a semiconductor production process.

For example, a pixel is formed on a support base, a filter is formed on the pixel, and a micro lens is formed on the top.

It is possible to configure various signal processing circuits, recognition processing circuits, memories, and the like in a support substrate or between the support substrate and the pixel.

With such a configuration, the device as a whole can be miniaturized and integrated.

6. Example of Overall Configuration of Imaging Device

Finally, an example of an overall configuration of an imaging device 100 will be described with reference to FIG. 13.

Figure 13:
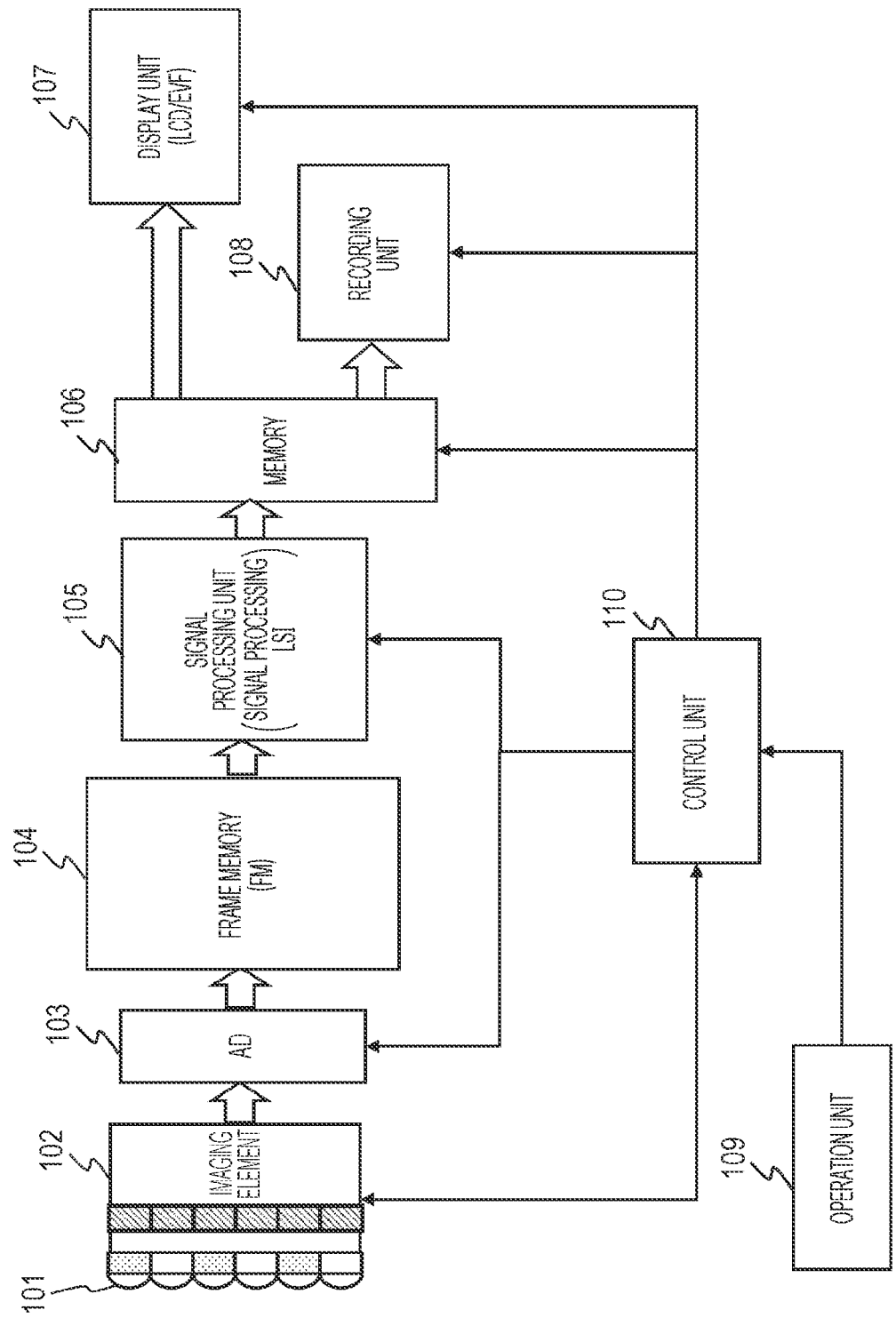
FIG. 13 is a diagram explaining an example of an overall configuration of the imaging device of the present disclosure.

The imaging device 100 illustrated in FIG. 13 includes micro lenses 101, an imaging element 102, an AD conversion unit 103, a frame memory 104, a signal processing unit (signal processing LSI) 105, a memory 106, a display unit (LCD/EVF) 107, a recording unit 108, an operation unit 109, and a control unit 110.

The operation unit 109 is, for example, a release button (shutter button), or an operation unit for performing user input such as settings of imaging form and imaging mode, and a setting of a display image of the display unit 107.

Note that it is also possible to use the display unit 107 in a form of a touch panel as a user operation unit.

The control unit 110 inputs control signals and synchronization signals to the imaging element 102 to the recording unit 108, and executes various types of process control such as control of process execution timing of each component unit.

For example, output control of a synchronization signal which defines a process timing of the imaging element 102, output control of a synchronization signal which defines a switch timing of a display image of the display unit 107, and the like are executed.

Specifically, the control unit 110 includes a CPU which executes processes in accordance with programs stored in a storage unit (not illustrated), and the like.

The programs include, for example, a control program for imaging of an image, recording of an image, and an image display process, a control program for output of a synchronization signal, and the like.

Light incident through the micro lenses 101 is incident on the imaging element 102, and image data obtained by photoelectric conversion is output. Note that the imaging element 102 includes the output control unit 70 and the gate control unit 60 in addition to the pixel 50 described above with reference to FIG. 6. Image data generated on the basis of an output image of the imaging element 102 is displayed on the display unit 107 and stored in the recording unit 108.

For example, the output image from the imaging element 102 is input to the AD conversion unit 103. The AD conversion unit 103 executes A/D conversion of an input signal, that is, a process of converting an analog signal into a digital signal, and stores a converted digital value in the frame memory 104.

Images stored in the frame memory 104 are sequentially output to the signal processing unit (signal processing LSI) 105.

The signal processing unit 105 executes signal processes in a general camera, for example, white balance (WB) adjustment, gamma correction, and the like.

The signal processing unit 105 generates at least one of an image for display to be displayed on the display unit 107 or an image for records to be stored in the recording unit 108, and stores such an image in the memory 106.

The display unit 107 displays the image for display stored in the memory 106. The display unit 107 includes, for example, an LCD, an EVF, or the like, and can be checked by a person who performs imaging.

Furthermore, the recording unit 108 stores the image for records stored in the memory 106.

7. Summary of Configuration of Present Disclosure

The embodiments of the present disclosure have been described above in detail with reference to the specific embodiments. However, it is obvious that those skilled in the art can make modifications and substitutions of the embodiments without departing from the gist of the present disclosure. That is, the present invention has been disclosed in a form of exemplification and should not be limitedly interpreted. In order to judge the gist of the present disclosure, the claims should be taken into consideration.

Note that the technology disclosed herein can have the following configurations.

(1) An imaging device,
in which an individual micro lens is provided for each pixel that constitutes an imaging element,
each pixel of the imaging element includes:
a high-sensitive pixel region at a central portion of the pixel; and
a low-sensitive pixel region surrounding the high-sensitive pixel region, and
central positions of the high-sensitive pixel region and the low-sensitive pixel region coincide with each other.

(2) The imaging device according to (1),
in which each pixel of the imaging element further includes:
a medium-sensitive pixel region between the high-sensitive pixel region and the low-sensitive pixel region, and
a central position of the medium-sensitive pixel region coincides with the central positions of the high-sensitive pixel region and the low-sensitive pixel region.

(3) The imaging device according to (1) or (2), in which each of the high-sensitive pixel region and the low-sensitive pixel region includes an individual photodiode (PD), and performs electric charge output corresponding to an amount of received light individually on a per region basis.

(4) The imaging device according to (2), in which each of the high-sensitive pixel region, the medium-sensitive pixel region, and the low-sensitive pixel region includes an individual photodiode (PD), and performs electric charge output corresponding to an amount of received light individually on a per region basis.

(5) The imaging device according to any one of (1) to (4),
in which each of a plurality of pixel regions with different sensitivities included in each pixel of the imaging element
is set to have a larger area as sensitivity in the region is higher.

(6) The imaging device according to any one of (1) to (5),
in which the imaging device includes:
an output control unit that calculates a pixel value corresponding to a pixel, and
the output control unit
calculates a pixel value corresponding to a pixel by a combination process of outputs of photodiodes (PDs) each being set corresponding to one of a plurality of pixel regions with different sensitivities.

(7) The imaging device according to (6),
in which the output control unit
executes, for each output of photodiodes (PDs) being set corresponding to one of a plurality of pixel regions with different sensitivities, switching control of whether or not to use each output for calculation of a pixel value, and executes a pixel value calculation process.

(8) The imaging device according to (7),
in which the output control unit
executes the switching control depending on whether or not each of the plurality of pixel regions with different sensitivities has reached a saturation level.

(9) The imaging device according to (8),
in which the output control unit
executes a pixel value calculation process using an output of a photodiode (PD) corresponding to the low-sensitive pixel region or the medium-sensitive pixel region, that are other than the high-sensitive pixel region, in a case where the high-sensitive pixel region has reached the saturation level.

(10) The imaging device according to any one of (1) to (9),
in which the imaging element
has a configuration in which a pixel center of a pixel in a peripheral region away from a central portion of the imaging element and a center of a micro lens corresponding to the pixel deviate from each other.

(11) The imaging device according to any one of (1) to (10),
in which the imaging device includes:
a color filter between the micro lens and the imaging element.

(12) The imaging device according to (11),
in which the color filter
includes any one of an RGB array, an RGBW array obtained by mixing a white (W) filter in an RGB array, or an RGBIR array obtained by mixing an infrared (IR) filter in an RGB array.

(13) An imaging element,
in which an individual micro lens is provided for each pixel that constitutes the imaging element,
each pixel of the imaging element includes:
a high-sensitive pixel region at a central portion of the pixel; and
a low-sensitive pixel region surrounding the high-sensitive pixel region, and
central positions of the high-sensitive pixel region and the low-sensitive pixel region coincide with each other.

(14) The imaging element according to (13),
in which each pixel of the imaging element further includes:

a medium-sensitive pixel region between the high-sensitive pixel region and the low-sensitive pixel region, and a central position of the medium-sensitive pixel region coincides with the central positions of the high-sensitive pixel region and the low-sensitive pixel region.

(15) The imaging element according to (13) or (14), in which each of the high-sensitive pixel region and the low-sensitive pixel region includes an individual photodiode (PD), and performs electric charge output corresponding to an amount of received light individually on a per region basis.

Note that the various processes described herein may be executed not only in time series in accordance with the description but also in parallel or individually depending on the processing capability of a device which executes the processes, or as needed.

INDUSTRIAL APPLICABILITY

As described above, according to the configuration of one embodiment of the present disclosure, a device is realized in which each pixel of an imaging element is divided into a plurality of pixel regions with different sensitivities of which central positions coincide with each other, and a high dynamic range image is generated on the basis of an output of each region.

Specifically, for example, an imaging element is included on which imaging light is incident through a micro lens corresponding to each pixel. Each pixel of the imaging element includes a high-sensitive pixel region at a central portion of the pixel and a low-sensitive pixel region configured at an inner peripheral portion near sides of the pixel and surrounding the high-sensitive pixel region, and has a configuration in which central positions of the high-sensitive pixel region and the low-sensitive pixel region coincide with each other. Moreover, a medium-sensitive pixel region may be included between the high-sensitive pixel region and the low-sensitive pixel region. Each region has an individual photodiode (PD), and performs electric charge output corresponding to the amount of received light individually on a per region basis, and a high dynamic range image is generated by combing these outputs.

By these processes, the device is realized in which each pixel of an imaging element is divided into a plurality of pixel regions with different sensitivities of which central positions coincide with each other, and a high dynamic range image is generated on the basis of an output of each region.

REFERENCE SIGNS LIST

11 Micro lens
12 Filter
13 Pixel
21 High-sensitive pixel region
22 Medium-sensitive pixel region
23 Low-sensitive pixel region
50 Pixel
60 Gate control unit
70 Output control unit
80 Signal processing unit
100 Imaging device
101 Micro lens
102 Imaging element
103 AD conversion unit
104 Frame memory
105 Signal processing unit
106 Memory
107 Display unit
108 Recording unit
109 Operation unit
110 Control unit

The invention claimed is:

1. An imaging device, comprising:
an imaging element;
an individual micro lens for each pixel that constitutes the imaging element, wherein
each pixel of the imaging element includes:
a first sensitive pixel region at a central portion of the pixel; and
a second sensitive pixel region that surrounds the high-sensitive pixel region, and
central positions of the high-sensitive pixel region and the low-sensitive pixel region coincide with each other; and
an output control unit configured to calculate a pixel value corresponding to a pixel by a combination process of outputs of photodiodes (PDs) each being set corresponding to one of a plurality of pixel regions with different sensitivities.

2. The imaging device according to claim 1, wherein each pixel of the imaging element further includes:
a medium-sensitive pixel region between the high-sensitive pixel region and the low-sensitive pixel region; and
a central position of the medium-sensitive pixel region coincides with the central positions of the high-sensitive pixel region and the low-sensitive pixel region.

3. The imaging device according to claim 1, wherein
each of the high-sensitive pixel region and the low-sensitive pixel region includes an individual photodiode (PD), and
each of the high-sensitive pixel region and the low-sensitive pixel region is configured to perform electric charge output corresponding to an amount of received light individually on a per region basis.

4. The imaging device according to claim 2, wherein
each of the high-sensitive pixel region, the medium-sensitive pixel region, and the low-sensitive pixel region includes an individual photodiode (PD), and
each of the high-sensitive pixel region, the medium-sensitive pixel region, and the low-sensitive pixel region is configured to perform electric charge output corresponding to an amount of received light individually on a per region basis.

5. The imaging device according to claim 1, wherein each of a plurality of pixel regions with different sensitivities included in each pixel of the imaging element is set to have a larger area as sensitivity in the region is higher.

6. The imaging device according to claim 1, wherein the output control unit is further configured to:
execute, for each output of photodiodes (PDs) being set corresponding to one of a plurality of pixel regions with different sensitivities, switching control of whether or not to use each output for the calculation of the pixel value; and
execute a pixel value calculation process based on the switching control.

7. The imaging device according to claim 6, wherein the output control unit is further configured to execute the switching control depending on whether or not each of the plurality of pixel regions with different sensitivities has reached a saturation level.

8. The imaging device according to claim 7, wherein the output control unit is further configured to execute the pixel value calculation process based on an output of a photodiode (PD) corresponding to the low-sensitive pixel region or the medium-sensitive pixel region, in a case where the high-sensitive pixel region has reached the saturation level.

9. The imaging device according to claim 1, wherein the imaging element has a configuration in which a pixel center of a pixel in a peripheral region away from a central portion of the imaging element and a center of a micro lens corresponding to the pixel deviate from each other.

10. The imaging device according to claim 1, wherein the imaging device further includes a color filter between the micro lens and the imaging element.

11. The imaging device according to claim 10, wherein the color filter includes one of an RGB array, an RGBW array obtained by mixing a white (W) filter in an RGB array, or an RGBIR array obtained by mixing an infrared (IR) filter in an RGB array.

12. The imaging device according to claim 10, wherein
the first-sensitive pixel region is a high-sensitive pixel region, and
the second-sensitive pixel region is a low-sensitive pixel region.

13. An imaging element, comprising:
an individual micro lens for each pixel that constitutes the imaging element, wherein each pixel of the imaging element includes:
a first sensitive pixel region at a central portion of the pixel; and
a second sensitive pixel region surrounding the high-sensitive pixel region, and
central positions of the high-sensitive pixel region and the low-sensitive pixel region coincide with each other; and
an output control unit configured to calculate a pixel value corresponding to a pixel by a combination process of outputs of photodiodes (PDs) each being set corresponding to one of a plurality of pixel regions with different sensitivities.

14. The imaging element according to claim 13, wherein each pixel of the imaging element further includes:
a medium-sensitive pixel region between the high-sensitive pixel region and the low-sensitive pixel region, and
a central position of the medium-sensitive pixel region coincides with the central positions of the high-sensitive pixel region and the low-sensitive pixel region.

15. The imaging element according to claim 13, wherein
each of the high-sensitive pixel region and the low-sensitive pixel region includes an individual photodiode (PD), and
each of the high-sensitive pixel region and the low-sensitive pixel region is configured to perform electric charge output corresponding to an amount of received light individually on a per region basis.

* * * * *